United States Patent
Nansei

(10) Patent No.: US 8,357,965 B2
(45) Date of Patent: Jan. 22, 2013

(54) SEMICONDUCTOR DEVICE HAVING MULTIPLE STORAGE REGIONS

(75) Inventor: Hiroyuki Nansei, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 188 days.

(21) Appl. No.: 12/005,869

(22) Filed: Dec. 28, 2007

(65) Prior Publication Data

US 2009/0020799 A1 Jan. 22, 2009

(30) Foreign Application Priority Data

Dec. 28, 2006 (JP) ................. 2006-355026

(51) Int. Cl.
- *H01L 29/76* (2006.01)
- *H01L 29/788* (2006.01)
- *H01L 29/792* (2006.01)
- *G11C 11/34* (2006.01)
- *G11C 16/04* (2006.01)
- *H01L 21/336* (2006.01)

(52) U.S. Cl. ........ 257/314; 257/315; 257/324; 438/259; 438/270; 438/287; 365/185.01; 365/185.26; 365/185.33

(58) Field of Classification Search .................. None
See application file for complete search history.

(56) References Cited

U.S. PATENT DOCUMENTS

| | | | |
|---|---|---|---|
| 5,386,132 A | 1/1995 | Wong | |
| 6,011,725 A | 1/2000 | Eitan | |
| 6,249,022 B1 | 6/2001 | Lin et al. | |
| 6,479,348 B1 | 11/2002 | Kamal et al. | |
| 6,617,215 B1 | 9/2003 | Halliyal et al. | |
| 6,639,269 B1 | 10/2003 | Hofmann et al. | |
| 6,717,205 B2 * | 4/2004 | Gratz | 257/316 |
| 6,844,584 B2 * | 1/2005 | Palm et al. | 257/315 |
| 6,867,455 B2 | 3/2005 | Itoh et al. | |
| 6,952,366 B2 | 10/2005 | Forbes | |
| 7,031,759 B2 * | 4/2006 | Wong et al. | 455/575.1 |
| 7,067,377 B1 | 6/2006 | Park et al. | |
| 7,075,832 B2 | 7/2006 | Mihnea et al. | |
| 7,221,018 B2 | 5/2007 | Forbes | |
| 7,274,069 B2 | 9/2007 | Deppe et al. | |
| 7,292,478 B2 | 11/2007 | Yu et al. | |

(Continued)

FOREIGN PATENT DOCUMENTS

| | | |
|---|---|---|
| EP | 1696491 | 8/2006 |
| EP | 1696491 A | 8/2006 |

(Continued)

OTHER PUBLICATIONS

Motorola Press Release, "The Wait is Over! New Motorola RAZR V3 Now Available Exclusively at Cingular Wireless", Nov. 16, 2004, pp. 1-2.*

(Continued)

*Primary Examiner* — N Drew Richards
*Assistant Examiner* — Michael Jung

(57) ABSTRACT

One embodiment in accordance with the invention can include a semiconductor device that includes: a groove that is formed in a semiconductor substrate; bottom oxide films that are formed on both side faces of the groove; two charge storage layers that are formed on side faces of the bottom oxide films; top oxide films that are formed on side faces of the two charge storage layers; and a silicon oxide layer that is formed on the bottom face of the groove, and has a smaller film thickness than the top oxide films.

20 Claims, 12 Drawing Sheets

U.S. PATENT DOCUMENTS

| | | |
|---|---|---|
| 7,297,592 B1 | 11/2007 | Ngo et al. |
| 7,339,239 B2 | 3/2008 | Forbes |
| 7,365,382 B2 | 4/2008 | Willer et al. |
| 7,399,673 B2 | 7/2008 | Tempel |
| 7,468,299 B2 | 12/2008 | Ho et al. |
| 7,535,048 B2 | 5/2009 | Prall et al. |
| 7,662,687 B2 | 2/2010 | Willer et al. |
| 7,683,424 B2 | 3/2010 | Forbes |
| 7,911,837 B2 | 3/2011 | Prall |
| 2002/0024092 A1* | 2/2002 | Palm et al. ............ 257/330 |
| 2005/0030780 A1 | 2/2005 | Deppe et al. |
| 2005/0128804 A1* | 6/2005 | Forbes ............ 365/185.01 |
| 2006/0192266 A1 | 8/2006 | Willer et al. |
| 2006/0279991 A1* | 12/2006 | Park et al. ............ 365/185.17 |
| 2006/0291281 A1* | 12/2006 | Wang et al. ............ 365/185.05 |
| 2007/0284650 A1* | 12/2007 | Willer ............ 257/324 |
| 2009/0029512 A1 | 1/2009 | Willer et al. |

FOREIGN PATENT DOCUMENTS

| | | |
|---|---|---|
| JP | 2004088055 | 3/2004 |
| JP | 2005/517301 A | 6/2005 |
| JP | 2005517301 | 6/2005 |

OTHER PUBLICATIONS

Vonage Press Release, "Vonage and UTStarcom Liberate Consumers From Their Traditional Phone Lines with Launch of Portable Wi-Fi Phone", Dec. 13, 2005, pp. 1-2.*

J. Willer et al., "UMEM: A U-shaped Non-Volatile Memory Cell", IEEE NVSM 2003, pp. 42-33.*

J. Willer et al., "UMEM: A U-shape Non-Volatile Memory Cell", IEEE NVSM 2003, pp. 42-43.

S. M. Sze, "Physics of Semiconductor Devices, Second Edition", John Wiley & Sons, New York, 1981, pp. 490-495.

* cited by examiner

SEMICONDUCTOR DEVICE HAVING MULTIPLE STORAGE REGIONS

CLAIM OF PRIORITY

This patent application claims the benefit and priority of the co-pending Japanese Patent Application No. JP2006-355026, filed on Dec. 28, 2006, the disclosure of which is hereby incorporated by reference.

BACKGROUND

In recent years, non-volatile memories that can retain data even when the power is switched off are widely used. In flash memories that are typical non-volatile memories, the transistors forming the memory cells have floating gates or insulation films that are known as charge storage layers. In such flash memories, charges are accumulated in the charge storage layers, so as to store data. An example of a flash memory having insulating films as charge storage layers is a flash memory with a SONOS (Silicon Oxide Nitride Oxide Silicon) structure that stores charges in the trapping layer of an ONO (Oxide/Nitride/Oxide) film. U.S. Pat. No. 6,011,725 discloses a SONOS flash memory (a conventional example 1) that has virtual-ground memory cells each replacing the source and drain with each other, and operating the source and drain in a symmetrical fashion. In the conventional example 1, the source and the drain are replaced with each other, and are operated in a symmetrical fashion, so that two charge storage regions can be formed in the charge storage layer between the source and drain in a single transistor. Accordingly, 2-bit data can be stored in each one transistor.

In the conventional example 1, however, the channel length becomes smaller as the memory cells are made smaller, and it becomes difficult to separate the two charge storage regions from each other in the charge storage layer between the source and drain. As a result, it becomes difficult to write charges in one charge storage region independently of the other charge storage region. To counter this problem, Japanese Unexamined Patent Publication No. 2005-517301 discloses a flash memory (a conventional example 2) that can have smaller memory cells. FIG. 1 is a cross-sectional view of the flash memory of the conventional example 2. As shown in FIG. 1, a groove 30 is formed in a semiconductor substrate 10, and an ONO film 20 formed with a bottom oxide film 14, trapping layer 16 as charge storage layers, and a top oxide film 18 is provided on both side faces of the groove 30. A word line 24 that also serves as a gate electrode is provided on the top oxide film 18. Bit lines 12 that also serve as a source and drain are provided on both sides of the groove 30 and in the semiconductor substrate 10.

In the conventional example 2, even if the distance between the bit lines 12 becomes shorter, a channel 51 having a channel length around the groove 30 is formed. Accordingly, a longer channel length can be obtained. In this manner, two charge storage layers that are separated from each other can be formed between the source and drain. Also, the trapping layers 16 are not formed on the bottom face of the groove 30, and include a right layer and a left layer. Thus, higher separability in writing charges into the left and right trapping layers is achieved.

In the conventional example 2, however, it is difficult to read the data stored in one trapping layer 16 independently of the other trapping layer 16 (or to determine whether charges are accumulated in the left and right trapping layers 16). Referring to FIG. 1, this problem is explained. Reading data from the left trapping layer 16 is performed as follows. The bit line 12 on the left side is the source, and the bit line 12 on the right side is the drain. When electrons are accumulated in the left trapping layer 16, the current flowing through the channel 51 between the source and drain becomes lower due to the electric field of the trapping layer 16. When no charges (electrons) are accumulated in the left trapping layer 16, the current flowing through the channel 51 becomes higher. By detecting the current, the data in the trapping layers 16 is read out.

However, as indicated by the arrow 50 in FIG. 1, the electric field formed by the charges in the right trapping layer 16 passes through the bottom oxide film 14 and the top oxide film 18 on the bottom face of the groove 30, and reaches the channel 51 in the vicinity of the left trapping layer 16. When the data stored in the left trapping layer 16 is read out, the current flowing through the channel 51 is affected by the charges accumulated in the right trapping layer 16. As a result, separate data reading becomes difficult.

SUMMARY

Various embodiments of the invention has been made in view of the above circumstances and provides a semiconductor device and a method of manufacturing the semiconductor device, by which the separability in read data at the time of reading data from the two charge storage layers formed on both side faces of each groove can be improved.

According to an embodiment of the invention, there is provided a semiconductor device including: a groove that is formed in a semiconductor substrate; bottom oxide films that are formed on both side faces of the groove; two charge storage layers that are formed on side faces of the bottom oxide films; top oxide films that are formed on side faces of the two charge storage layers; and a silicon oxide layer that is formed on a bottom face of the groove, and has a smaller film thickness than the top oxide films. With this structure, the separability in read data at the time of data reading can be improved.

In one embodiment, the semiconductor device may further include a gate electrode corresponding to the two charge storage layers, the gate electrode being formed on side faces of the top oxide films and on the silicon oxide layer. Since the silicon oxide layer is thin in this structure, the electric field from the gate electrode becomes larger, and higher channel controllability can be achieved.

According to an embodiment of the present invention, there is provided a semiconductor device including: a groove that is formed in a semiconductor substrate; bottom oxide films that are formed on both side faces of the groove; two charge storage layers that are formed on side faces of the bottom oxide films; top oxide films that are formed on side faces of the two charge storage layers; and a second groove that is formed in a portion of the semiconductor substrate, the portion being located between the two charge storage layers. With this structure, the separability in read data at the time of data reading can be improved.

In one embodiment, the semiconductor device may further include a gate electrode corresponding to the two charge storage layers, the gate electrode being formed on side faces of the top oxide films and in the second groove. With this structure, the separability in read data at the time of data reading can be further improved.

In one embodiment, the semiconductor device may further include a silicon oxide layer that is provided on a bottom face of the second groove, and has a smaller film thickness than the top oxide films. With this structure, the separability in read data at the time of data reading can be further improved.

In one embodiment, the semiconductor device may further include a bit line that is provided on either side of the groove and in the semiconductor substrate. The semiconductor device may be configured so that the charge storage layers include silicon nitride films. The semiconductor device may be configured so that the charge storage layers include floating gates.

According to an embodiment of the present invention, there is provided a method of manufacturing a semiconductor device, including: forming a groove in a semiconductor substrate; forming a charge storage layer on side faces and a bottom face of the groove; removing a portion of the charge storage layer located on the bottom face of the groove, with portions of the charge storage layer on the side faces of the groove serving as a mask; forming a top oxide film on side faces of the charge storage layer; and forming a silicon oxide layer on the bottom face of the groove, the silicon oxide layer having a smaller film thickness than the top oxide film. With this structure, a semiconductor device that can improve the separability in read data at the time of data reading can be produced.

In one embodiment, the method may be configured so that the forming the top oxide film includes forming the top oxide film on the charge storage layer formed on the side faces and the bottom face of the groove; and that the removing a portion of the charge storage layer includes removing the portion of the charge storage layer and a portion of the top oxide film located on the bottom face of the groove, with the portions of the charge storage layer and portions of the top oxide film on the side faces of the groove serving as a mask. By this method, a silicon oxide layer that is thinner than the top oxide film can be easily formed on the bottom face of the groove.

In an embodiment, the method may further include forming a bottom oxide film on the side faces and the bottom face of the groove, wherein the removing a portion of the charge storage layer includes: removing the portion of the charge storage layer and a portion of the bottom oxide film located on the bottom face of the groove, with the portions of the charge storage layer and portions of the bottom oxide film on the side faces of the groove serving as a mask; and forming top faces of the charge storage layer on the side faces of the groove in lower positions than top faces of the bottom oxide film on the side faces of the groove. By this method, the top oxide film on the charge storage layer can be made thicker. Accordingly, a semiconductor device with higher reliability can be produced.

According to an embodiment of the present invention, there is provided a method of manufacturing a semiconductor device, including: forming a groove in a semiconductor substrate; forming a charge storage layer on side faces and a bottom face of the groove; removing a portion of the charge storage layer located on the bottom face of the groove, with portions of the charge storage layer on the side faces of the groove serving as a mask; forming a second groove in the semiconductor substrate by performing etching on the bottom face of the groove, with the portions of the charge storage layer on the side faces of the groove serving as a mask; and forming a silicon oxide layer on side faces and a bottom face of the second groove. With this structure, a semiconductor device that can improve the separability in read data at the time of data reading can be produced.

According to one embodiment of the present invention, there is provided a method of manufacturing a semiconductor device, including: forming an insulating layer having an opening on a semiconductor substrate; forming a groove by performing etching on a portion of the semiconductor substrate, the portion being located below the opening; forming a charge storage layer on side faces and a bottom face of the groove; removing a portion of the charge storage layer located on the bottom face of the groove, with portions of the charge storage layer on the side faces of the groove serving as a mask; and forming a gate electrode in the groove and on the insulating layer, wherein the removing a portion of the charge storage layer includes removing the portion of the charge storage layer in such a manner that the insulating layer remains on the semiconductor substrate. According to this aspect, by a method of manufacturing a semiconductor device that can improve the separability in read data at the time of data reading, the gate electrode and the semiconductor substrate can be easily separated electrically from each other.

As described above, various embodiment of the present invention can provide a semiconductor device and a method of manufacturing the semiconductor device, by which the separability in read data at the time of reading data from the two charge storage layers formed on both side faces of each groove can be improved.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
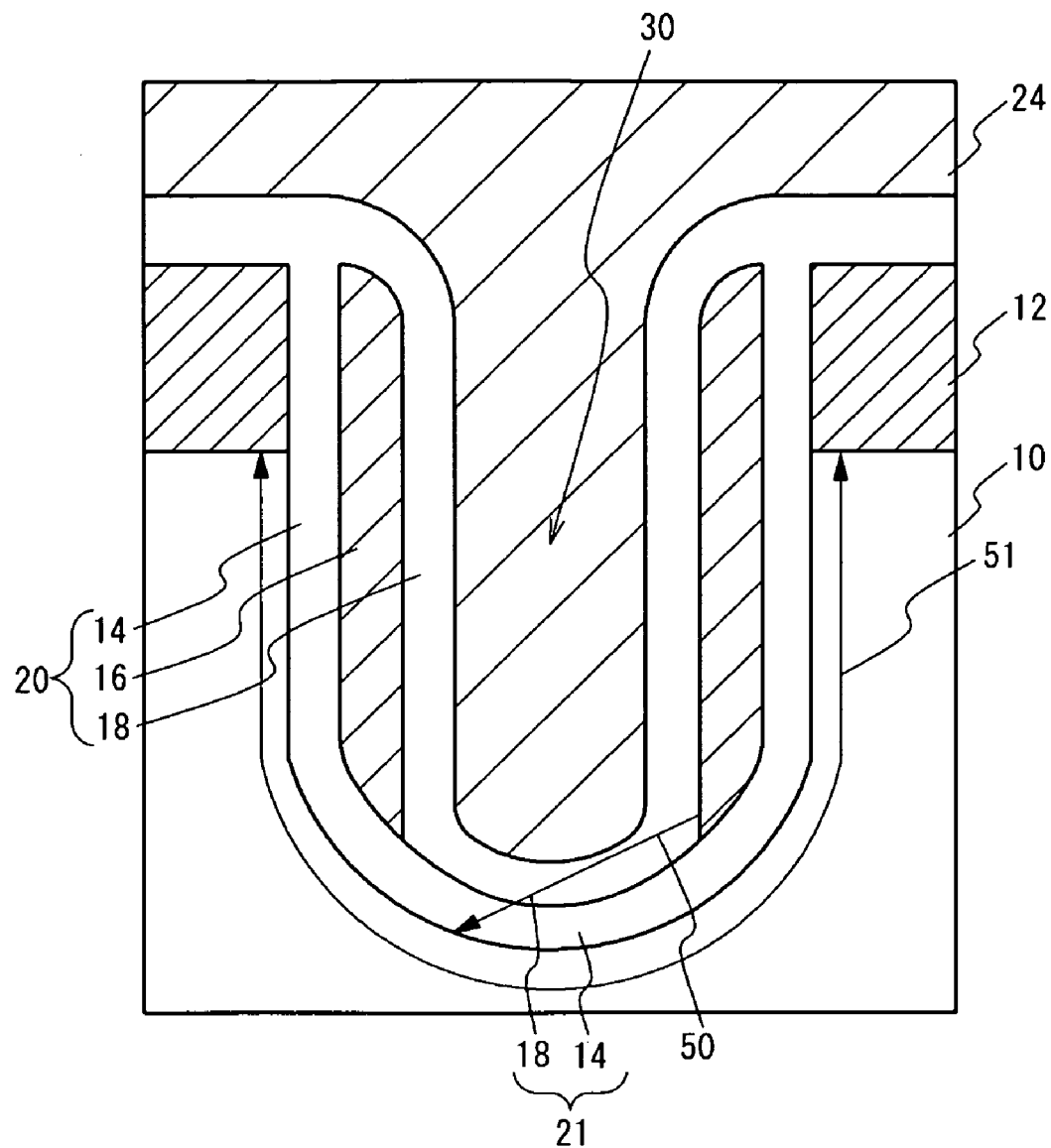
FIG. 1 is a cross-sectional view of a flash memory of a conventional example.
Figure 2A:
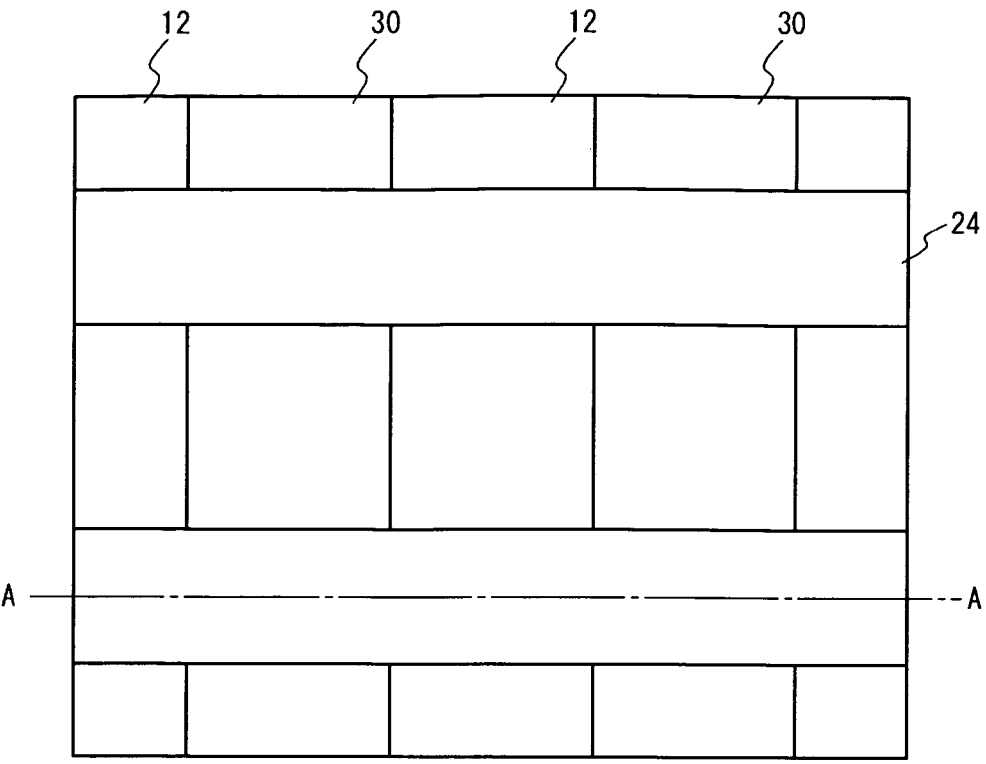
FIG. 2A is a top view of a flash memory in accordance with an embodiment of the present invention.
Figure 2B:
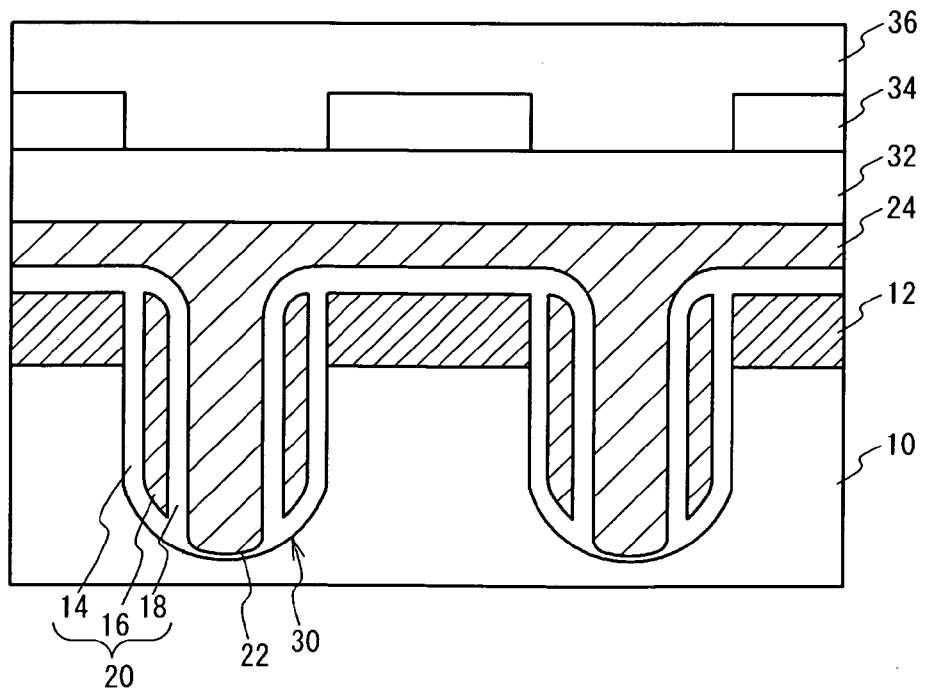
FIG. 2B is a cross-sectional view of the flash memory, taken along the line A-A of FIG. 2A in accordance with an embodiment of the present invention.

FIG. 2A is a top view of a flash memory in accordance with an embodiment of the present invention (a protection film 36, wiring layers 34, an interlayer insulating film 32, and an ONO film 20 are not shown). FIG. 2B is a cross-sectional view of the flash memory, taken along the line A-A of FIG. 2A. As shown in FIG. 2A, grooves 30 are formed in a semiconductor substrate 10, and bit lines 12 that also serve as sources and drains are provided on both sides of each of the grooves 30 in the semiconductor substrate 10. Word lines 24 that also serve as gates extend in the width direction of the bit lines 12. As shown in FIG. 2B, an ONO film 20 is provided on both side faces of each groove 30, as in the conventional example 2 shown in FIG. 1. A silicon oxide layer 22 having a smaller film thickness than a top oxide film 18 is provided on the bottom face of each of the grooves 30. The word lines 24 are provided between the two top oxide films in each groove 30 and on the silicon oxide layer 22 in each groove 30. The interlayer insulating film 32 that is formed with a silicon oxide film, for example, is provided over the word lines 24. The wiring layers 34 that are made of aluminum or copper, for example, are provided on the interlayer insulating film 32 above the bit lines 12. The wiring layers 34 extend in the extending direction of the bit lines 12. The protection film 36 that is formed with a silicon oxide film, for example, is provided to cover the wiring layers 34.

Figure 3A:
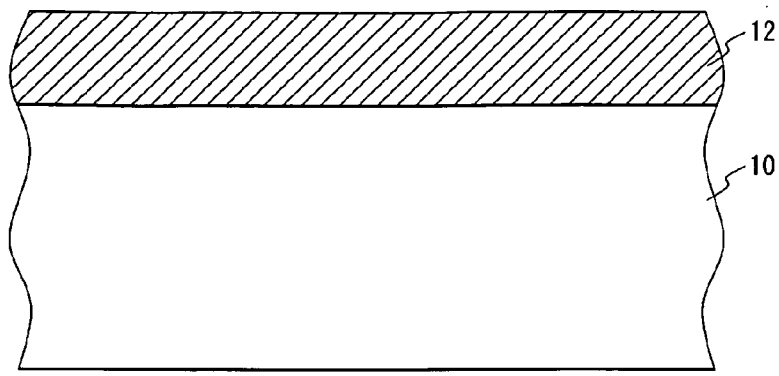
FIG. 3A through FIG. 3C are cross-sectional views illustrating the first half of the procedures for manufacturing the flash memory in accordance with an embodiment.

Referring now to FIG. 3A through FIG. 4C, a method of manufacturing the flash memory in accordance with an embodiment is described. As shown in FIG. 3A, arsenic ions are injected into the upper portion of a p-type silicon semiconductor substrate (or a p-type well in a semiconductor substrate) 10, for example. Heat treatment is then carried out to form an n-type diffusion layer 12 (to be the bit lines 12) having a depth of approximately 50 nm. As shown in FIG. 3B, a bit lines insulating film 40 that is an insulating film such as a silicon oxide film is formed on the n-type diffusion layer 12. The bit line insulating film 40 is formed by a thermal oxidation technique or CVD. However, to prevent diffusion of the n-type diffusion layer, in one embodiment, it is preferable to form the bit line insulating film 40 by a plasma oxidation technique or plasma CVD at a low temperature. As shown in FIG. 3C, etching is performed on the bit line insulating film 40 and the semiconductor substrate 10 with a photoresist by RIE (Reactive Ion Etching). By doing so, the grooves 30 each having a depth of approximately 80 nm and a width of approximately 100 nm, and each having a U-like shape, are formed in the semiconductor substrate 10. The bit lines 12 are formed from the n-type diffusion layer 12 on both sides of each of the grooves 30. The grooves 30 may each have a rectangular shape, but in one embodiment it is preferable to form the grooves 30 each having a U-like shape, so as to prevent field concentration to the corner portions of the grooves 30.

Figure 4A:
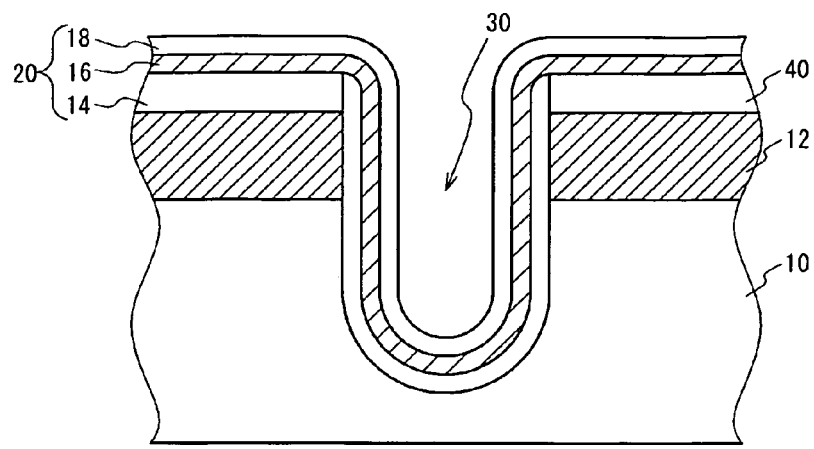
FIG. 4A through FIG. 4C are cross-sectional views illustrating the second half of the procedures for manufacturing the flash memory in accordance with an embodiment.

As shown in FIG. 4A, a bottom oxide film 14 that is a silicon oxide film is formed on both sides and the bottom face of each groove 30. The bottom oxide film 14 may be formed by CVD, a thermal oxidation technique, a plasma oxidation technique, LPRO (Low Pressure Radical Oxidation), or ISSG (In-Situ Steam Generation). To form a high-quality silicon oxide film, in one embodiment, it is preferable to utilize a thermal oxidation technique, a plasma oxidation technique, LPRO, or ISSG, each of which is a direct oxidation technique. A trapping layer 16 that is a silicon nitride film is formed on the side faces and the bottom face of the bottom oxide film 14. In view of charge retention properties, in one embodiment, it is preferable to form the trapping layer 16 by thermal CVD. A top oxide film 18 that is a silicon oxide film is formed on the side faces and the bottom-face of the trapping layer 16. In one embodiment, it is preferable to form the top oxide film 18 by CVD, which can readily secure a sufficient film thickness. In the above manner, the ONO film 20 including the bottom oxide film 14, the trapping layer 16, and the top oxide film 18 is formed.

Figure 4B:
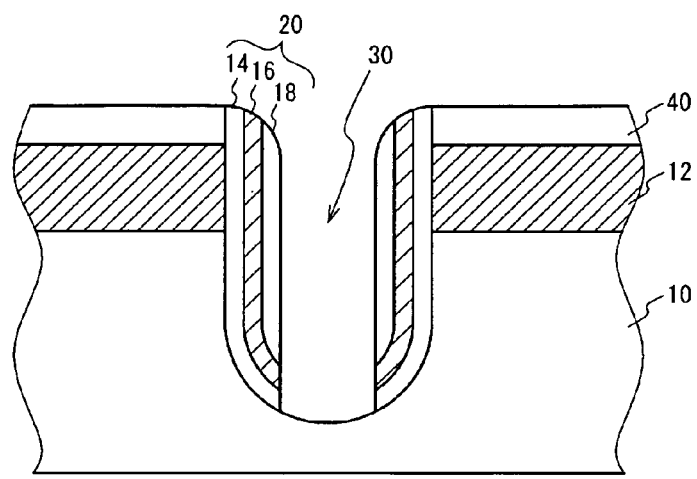
Figure 4C:
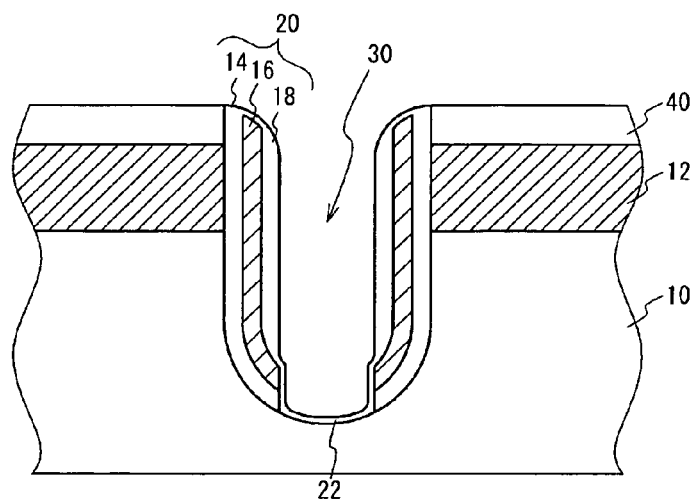

As shown in FIG. 4B, etching is performed on the entire surface of the top oxide film 18, the trapping layer 16, and the bottom oxide film 14 by RIE, so as to leave portions of the ONO film 20 on the side faces of each groove 30. Even if overetching is caused at this point, the bit line insulating films 40 can prevent exposure of the bit lines 12. Meanwhile, the semiconductor substrate 10 is exposed through the bottom face of each groove 30. As shown in FIG. 4C, a silicon oxide layer 22 is formed on the bottom face of each groove 30. To achieve high film quality, in one embodiment, it is preferable to form the silicon oxide layer 22 by a thermal oxidation technique, a plasma oxidation technique, or ISSG. Here, the film thickness of the silicon oxide layer 22 is made smaller than the film thickness of the top oxide film 18. The end faces of the trapping layers 16 are also oxidized to form silicon oxide films. The word lines 24 made of polysilicon are then formed between the top oxide films 18 and on the silicon oxide layer 22 in each groove 30. The word lines 24 are also formed on the bit line insulating films 40. Since the word lines 24 can be formed above the bit lines 12 via the bit line insulating films 40, the word lines 24 can be electrically isolated from the bit lines 12. Further, the interlayer insulating film 32, the wiring layers 34, and the protection film 36 are formed. Thus, the flash memory in accordance with an embodiment is completed.

Figure 5:
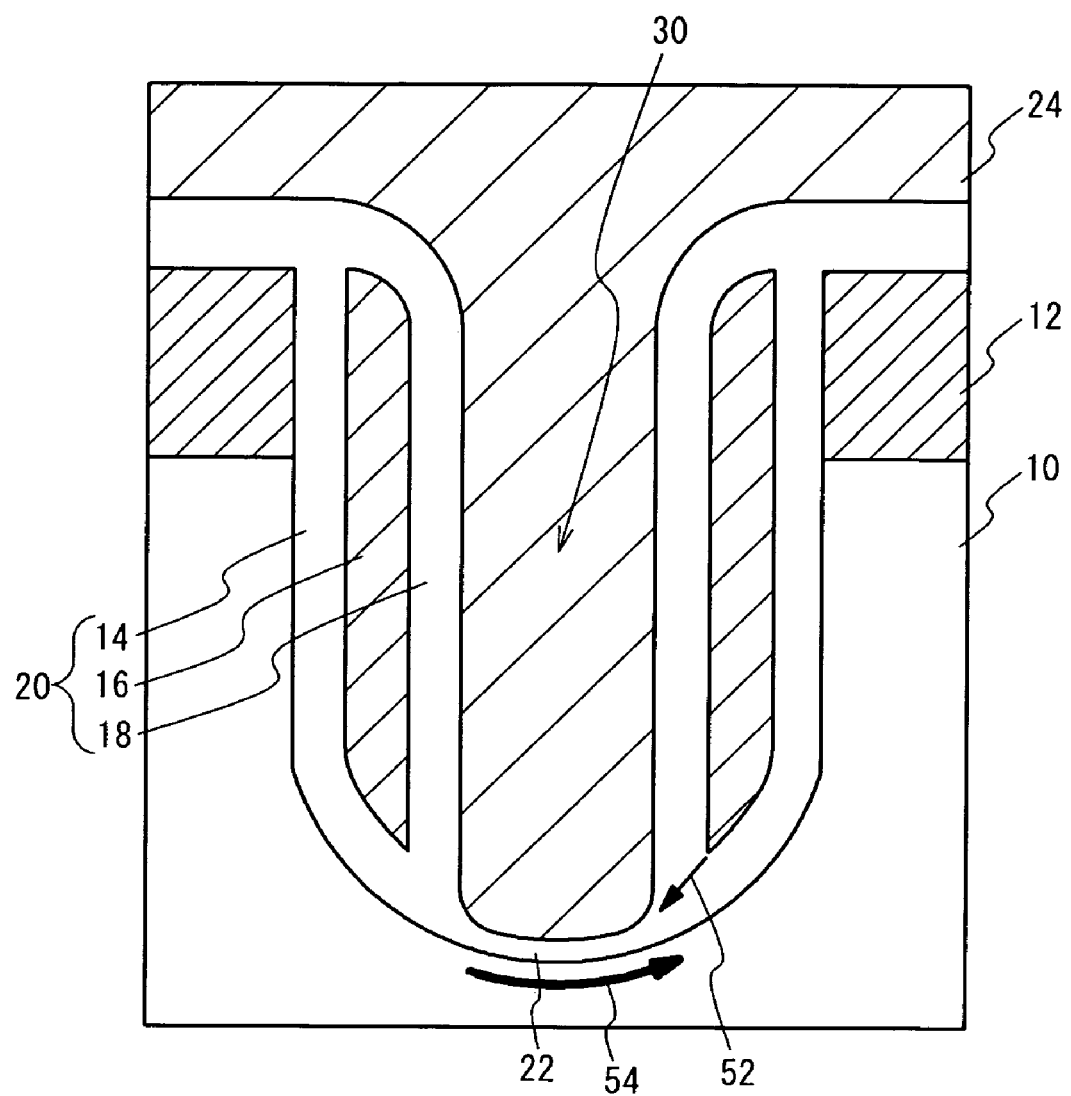
FIG. 5 illustrates the effects of the flash memory in accordance with an embodiment.

FIG. 5 illustrates the effects of an embodiment. The film thickness of the oxide silicon layer 22 on the bottom face of each groove 30 is approximately 5 nm, for example, and the film thickness of each top oxide film 18 on the side faces of the groove 30 is approximately 10 nm, for example. The film thickness of the silicon oxide layer 22 is smaller than the film thickness of each top oxide film 18. The other aspects of the structure are the same as those shown in FIG. 1. The same components as those shown in FIG. 1 are denoted by the same reference numerals as those in FIG. 1, and explanation of them is omitted here. When data is read from the left trapping layer 16 shown in FIG. 5, the electric field formed by the charges stored in the right trapping layer 16 does not reach the left side, as indicated by the arrow 52 in FIG. 5. Accordingly, the separability in read data when data is read out can be improved.

One word line 24 (a gate electrode) corresponding to two charge storage layers is provided on the side faces of the top oxide films 18 and on the silicon oxide layer 22. Since the silicon oxide layer 22 is thin, the electric field from the word line 24 (the gate electrode), and the controllability of a channel 54 is increased accordingly. Thus, a sufficiently high current ON/OFF ratio can be secured for the current flowing through the channel 54, and the operation margin of the transistor becomes larger.

By the method of manufacturing the flash memory in accordance with an embodiment, the bottom oxide film 14, the trapping layer 16 as a charge storage layer, and the top oxide film 18 are formed on the side faces and the bottom face of each groove 30, as shown in FIG. 4A. With the bottom oxide film 14, the trapping layer 16, and the top oxide film 18 serving as masks on the side faces of each groove 30, the portions of the bottom oxide film 14, the trapping layer 16, and the top oxide film 18 on the bottom face of the groove 30 are removed, as shown in FIG. 4B. Accordingly, the silicon oxide layer 22 thinner than the top oxide film 18 can be easily formed on the bottom face of the groove 30, as shown in FIG. 4C.

Figure 3B:
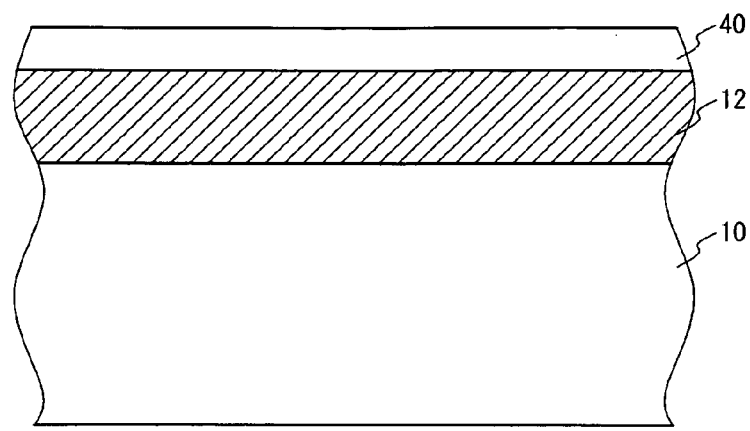
Figure 3C:
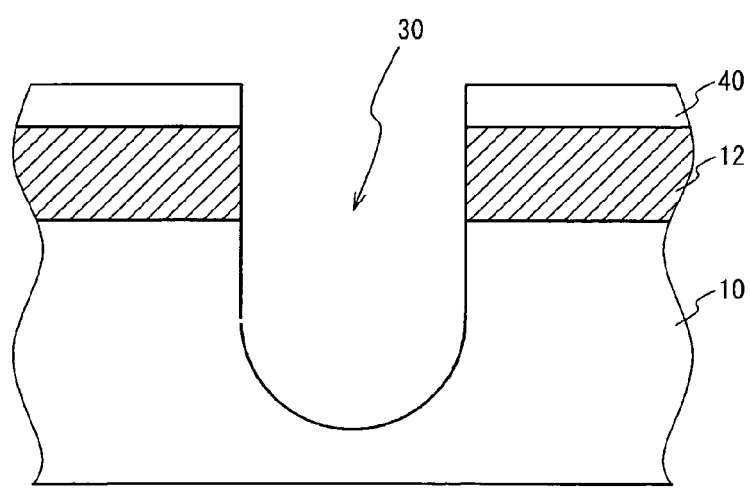

Further, the bit line insulating film 40 (the insulating layer) having openings is formed on the semiconductor substrate 10, and etching is performed on the semiconductor substrate 10 through the openings of the bit line insulating film 40, so as to form the grooves 30, as shown in FIG. 3C. When the portions of the bottom oxide film 14, the trapping layer 16, and the top oxide film 18 on the bottom face of each groove 30 are removed while the portions of the bottom oxide film 14, the trapping layer 16, and the top oxide film 18 on the side faces of the groove 30 serve as masks, the removal of the portions of the bottom oxide film 14, the trapping layer 16, and the top oxide film 18 is carried out so that the bit line insulating film 40 above the semiconductor substrate 10 can stay on. In this manner, the word lines 24 (the gate electrodes) can be formed in the grooves 30 and on the bit line insulating film 40. Accordingly, the electric isolation of the word lines 24 from the semiconductor substrate 10 can be easily achieved.

Figure 6A:
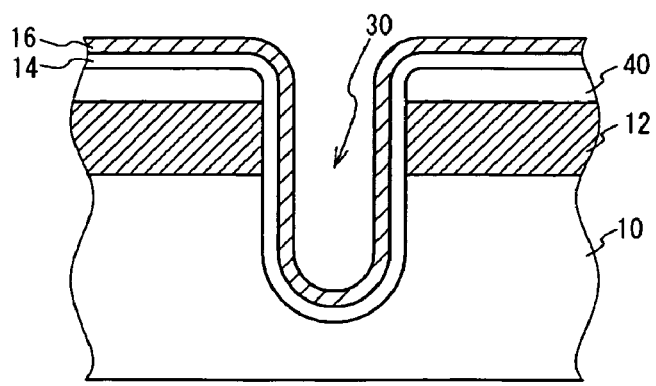
FIG. 6A through FIG. 6D are cross-sectional views illustrating the procedures for manufacturing a flash memory in accordance with an embodiment of the invention.
Figure 6B:
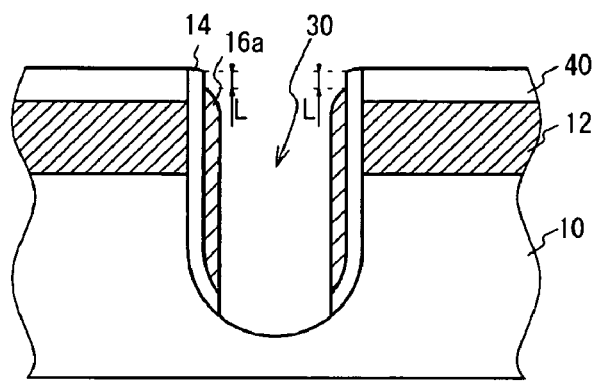

FIG. 6A through FIG. 6D illustrate a method of manufacturing a flash memory in accordance with a second embodiment of the present invention. As shown in FIG. 6A, after the procedures shown in FIG. 3A through FIG. 3C are carried out, a bottom oxide film 14 and a trapping layer 16 are formed in the same manner as in the procedure shown in FIG. 4A. As shown in FIG. 6B, etching is performed on the entire surface of the trapping layer 16 and the bottom oxide film 14. Accordingly, the trapping layer 16 and the bottom oxide film 14 remain on the side faces of each groove 30, and the semiconductor substrate 10 is exposed through the bottom face of each groove 30. Further, etching is performed on the trapping layer 16, which is a silicon nitride film. As a result, the upper face of each trapping layer 16a becomes approximately 10 nm (indicated by L in FIG. 6B) lower than each bottom oxide film 14. Since the top oxide film to be later formed on the upper face of each trapping layer 16a is made thick, in one embodiment, the step L should preferably be larger than the thickness of each trapping layer 16a.

Figure 6C:
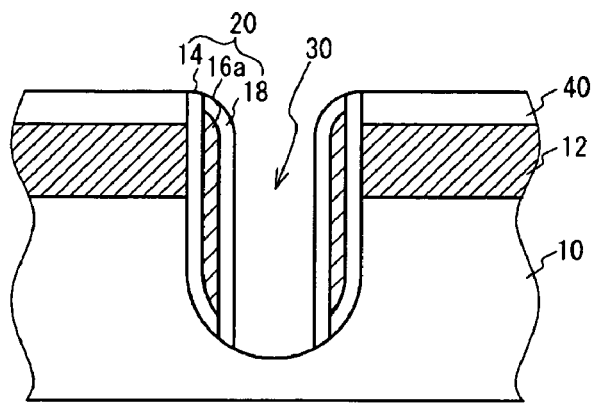
Figure 6D:
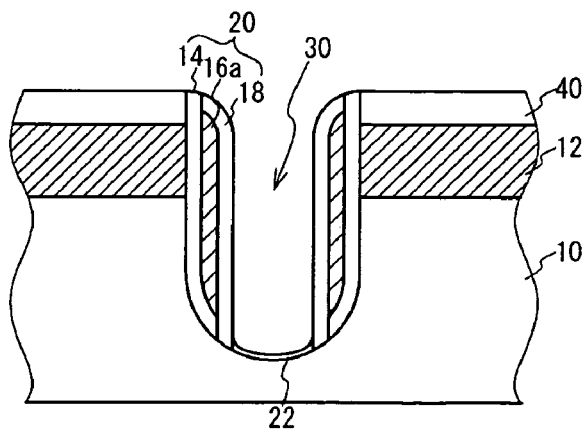

As shown in FIG. 6C, a top oxide film 18 is formed on the side faces of the trapping layers 16a and on the bottom face of each groove 30 by CVD, for example. Here, in one embodiment, the top oxide film 18 should preferably be thicker than each trapping layer 16a. Since the upper face of each trapping layer 16a is located lower than the upper face of each bottom oxide film 14, the top oxide film 18 thicker than the bottom face of each groove 30 is formed on the upper face of each trapping layer 16a. Etching is then performed on the top oxide film 18. As a result, the semiconductor substrate 10 is exposed through the bottom face of each groove 30. At this point, the top oxide film 18 remains on the upper faces of the trapping layers 16a. As shown in FIG. 6D, a silicon oxide layer 22 is formed by oxidizing the bottom face of each groove 30 by a direct oxidation technique such as a thermal oxidation technique. Here, the film thickness of the silicon oxide layer 22 is smaller than the film thickness of the top oxide film 18. The word lines 24, the interlayer insulating film, the wiring layers, and the protection film are then formed to complete the flash memory.

In an embodiment, the silicon oxide film formed on the trapping layers 16 on the side faces of each groove 30 has substantially the same film thickness as the silicon oxide layer 22 on the bottom face of the groove 30, as shown in FIG. 4C. In such a case, reliability degradation might be caused. On the other hand, by the method of manufacturing a flash memory in accordance with an embodiment, when the portion of the trapping layer 16 on the bottom face of each groove 30 is removed, the upper face of each of the trapping layers 16a on the side faces of the groove 30 is located lower than the upper face of each of the bottom oxide films 14 on the side faces of the groove 30, as shown in FIG. 6B. Accordingly, when the top oxide film 18 is formed, the thickness of the silicon oxide film formed on each trapping layer 16a can be made larger than the film thickness of the silicon oxide layer 22 on the bottom face of each groove 30, as shown in FIG. 6D. Note that this embodiment having the above structure has no probability of reliability degradation.

Figure 7A:
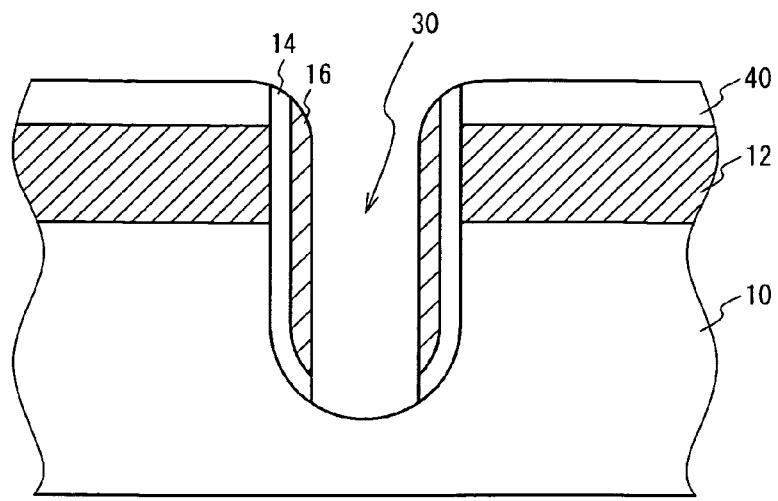
FIG. 7A through FIG. 7C are cross-sectional views illustrating the procedures for manufacturing a flash memory in accordance with an embodiment of the invention.
Figure 7B:
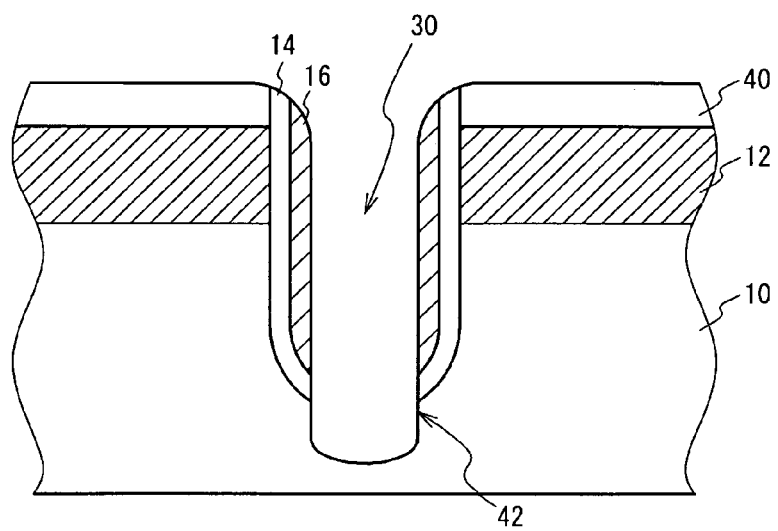
Figure 7C:
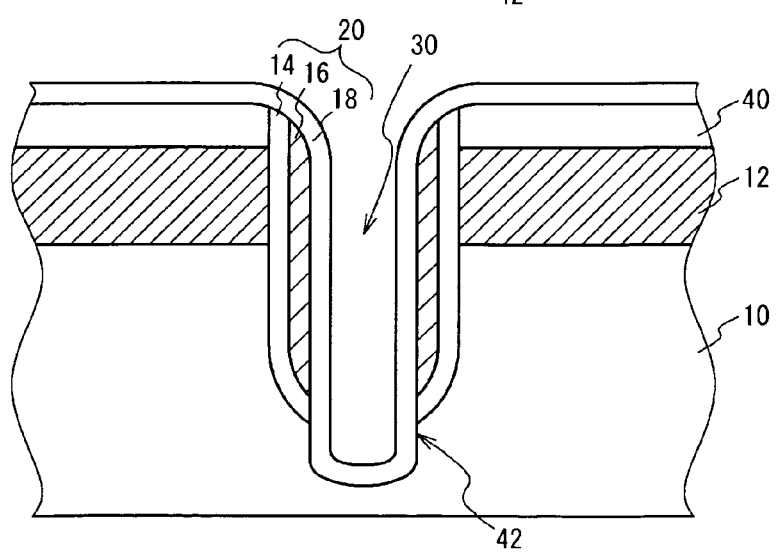

A third embodiment of the present invention is an example case where a second groove 42 is formed in the bottom face of each groove 30. As shown in FIG. 7A, after the procedure of an embodiment shown in FIG. 6A is carried out, the portions of the bottom oxide film 14 and the trapping layer 16 on the bottom face of each groove 30 are removed, with the portions of the bottom oxide film 14 and the trapping layer 16 on the side faces of the groove 30 serving as masks. As shown in FIG. 7B, with the bit line insulating films 40, the bottom oxide films 14, and the trapping layers 16 serving as masks, etching is performed on the bottom face of the groove 30 by RIE, so as to form the second groove 42 having a depth of approximately 20 nm, for example, and a width of approximately 20 nm, for example. The second groove 42 has a U-like shape. As shown in FIG. 7C, a top oxide film 18 is formed on the side faces of the trapping layers 16 and the side faces and the bottom face of the second groove 42. The word lines 24, the interlayer insulating film, the wiring layers, and the protection film are then formed to complete the flash memory.

Figure 8:
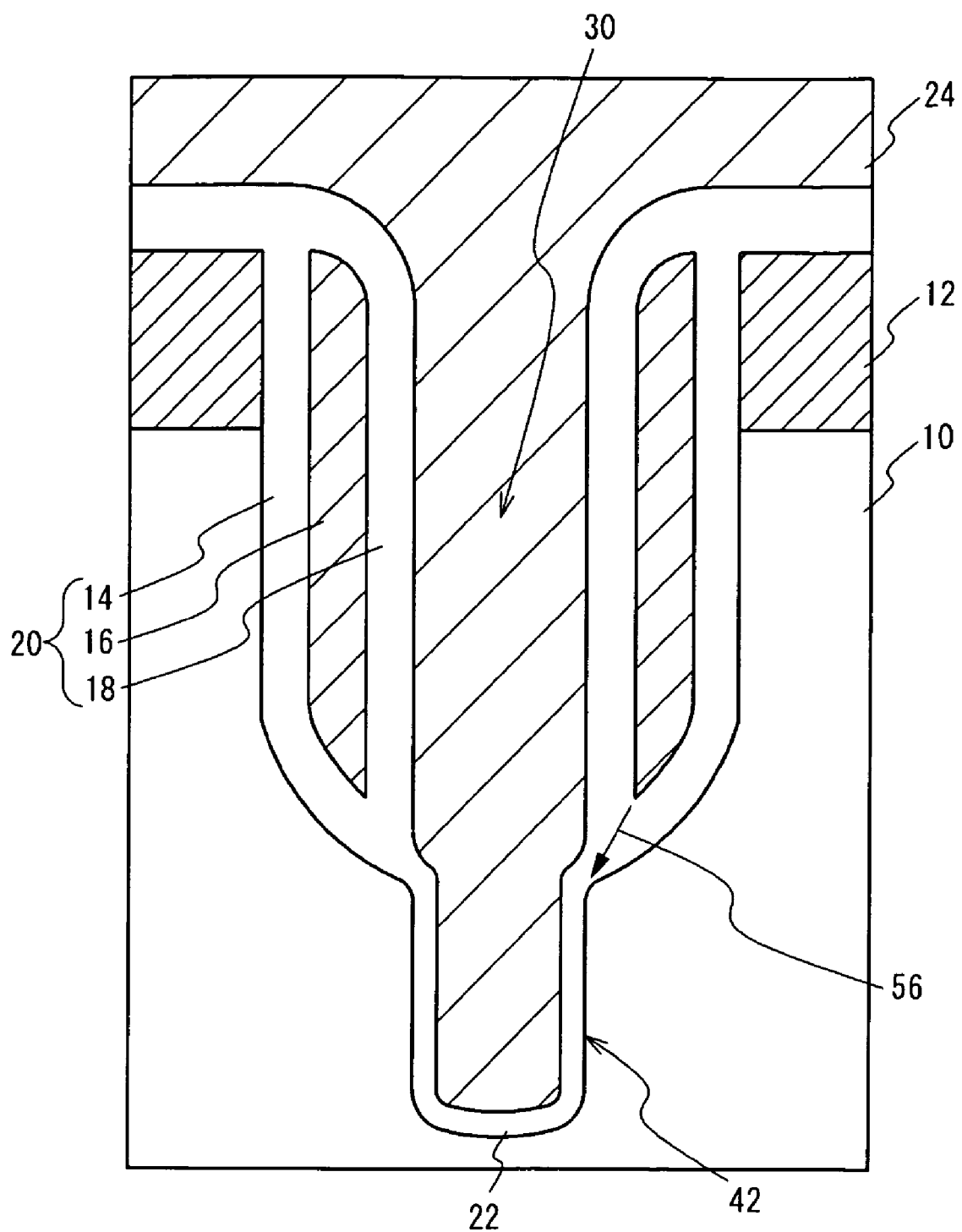
FIG. 8 is a cross-sectional view for explaining the effects of the flash memory in accordance with an embodiment.

FIG. 8 is a cross-sectional view of the flash memory in accordance with an embodiment. The second groove 42 is formed in the portion of the semiconductor substrate located between the two trapping layers 16 in the groove 30. One word line 24 (a gate electrode) corresponding to the two trapping layers 16 is also provided on the side faces of the top oxide films 18 and in the second groove 42. The other aspects of this structure are the same as those of an embodiment shown in FIG. 5. The same components as those shown in FIG. 5 are denoted by the same reference numerals as those in FIG. 5, and explanation of them is omitted here. In accordance with an embodiment, when data is read from the left trapping layer 16 through the word line 24 in the groove 42, the electric field formed by the charges stored in the right trapping layer 16 does not reach the left side, as indicated by the arrow 56 in FIG. 8. Accordingly, the separability in read data when data is read out can be improved.

As the flash memory of an embodiment is manufactured by the manufacturing method illustrated in FIG. 7A through FIG. 7C, the film thickness of the silicon oxide layer 22 in the second groove 42 becomes substantially the same as the film thickness of each top oxide film 18. In this manner, even if the film thickness of the silicon oxide layer 22 is equal to or larger than the film thickness of each top oxide film 18, the word line 24 in the second groove 42 can prevent the electric field of the charges stored in the right trapping layer 16 from reaching the left side.

As shown in FIG. 8, the film thickness of the silicon oxide layer 22 is made smaller than the film thickness of each top oxide film 18, so that the electric field of the charges stored in the right trapping layer 16 can be more effectively prevented from reaching the left side. Accordingly, the separability in read data when data is read out can be further improved. The flash memory shown in FIG. 8 may be manufactured in the following manner. After the procedure shown in FIG. 6C is carried out, etching is performed on the semiconductor substrate 10 to form a second groove, with the top oxide films 18 and the bit line insulating films 40 serving as masks. A thin silicon oxide film is then formed on the side faces and the bottom face of the second groove in the same manner as in FIG. 6D.

By the method of manufacturing a flash memory in accordance with an embodiment, a second groove 42 is formed by performing etching on the bottom face of each groove 30, while the portions of the bottom oxide films 14 and the trapping layers 16 on the side faces of the groove 30 serve as masks, as shown in FIG. 7B. Further, as shown in FIG. 7C, a silicon oxide layer is formed on the side faces and the bottom face of the second groove 42 at the same time as the formation of the top oxide films 18. In this manner, while the bottom oxide films 14 and the trapping layers 16 are not formed in the second groove 42, the silicon oxide layer is formed, so as to narrow the second groove 42 and reduce the size of the second groove 42. In a case where the ONO film 20 is formed in the second groove 42, for example, the width of the second groove 42 needs to be 50 nm or more. In a case where just a silicon oxide layer is formed in the second groove 42 as in an embodiment, on the other hand, the width of the second groove 42 can be approximately 20 nm.

Figure 9:
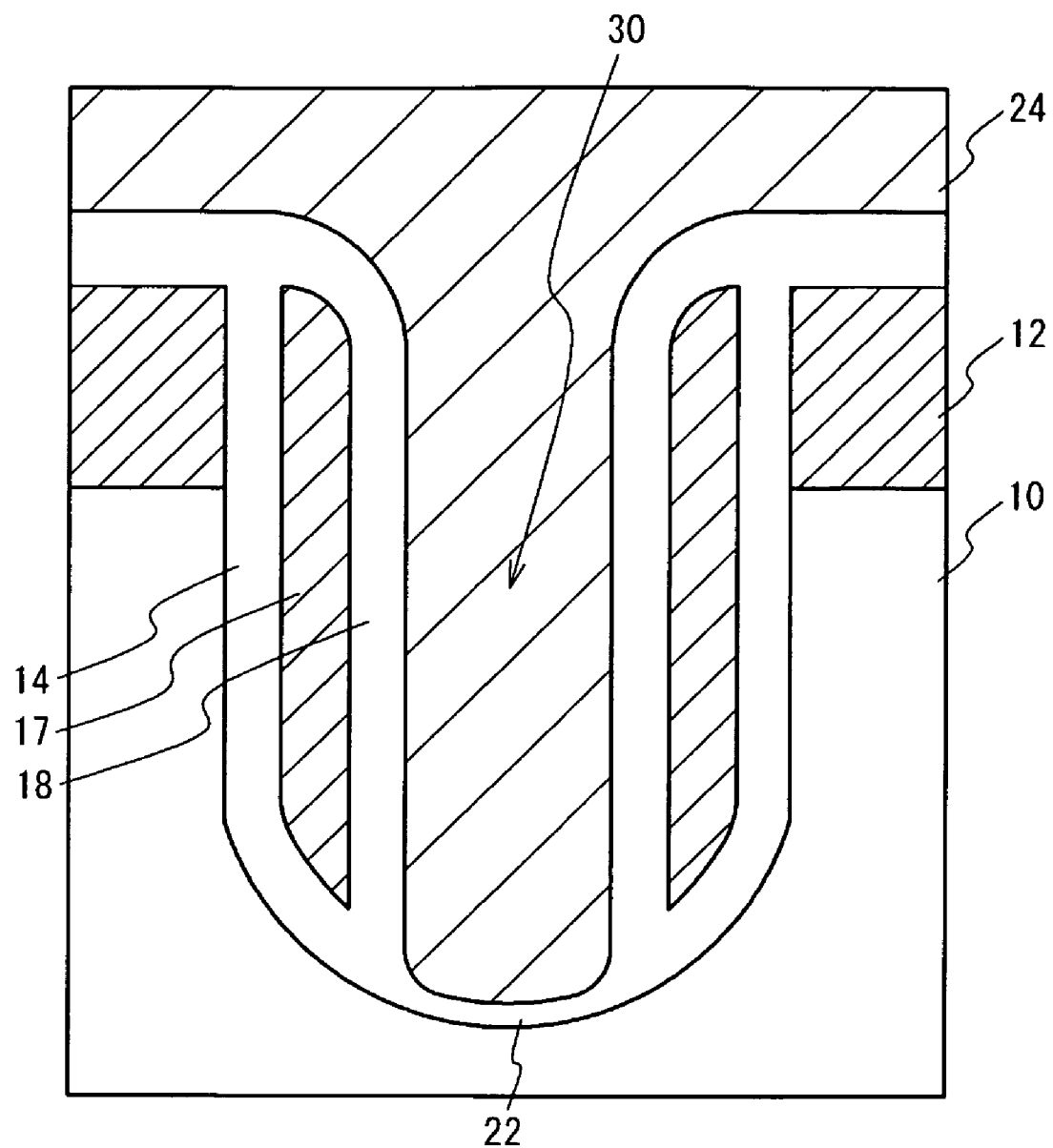
FIG. 9 is a cross-sectional view of a flash memory in accordance with an embodiment of the invention.

A fourth embodiment of the present invention is an example case where the charge storage layers are floating gates. FIG. 9 is a cross-sectional view of a flash memory in accordance with an embodiment. Unlike the charge storage layers of an embodiment, the charge storage layers of the flash memory in accordance with this embodiment are formed with polysilicon layers 17. The other aspects of this embodiment are the same as those of an embodiment. The same components as those of an embodiment are denoted by the same reference numerals used in an embodiment, and explanation of them is omitted here. As in an embodiment, floating gates formed with conductive layers such as polysilicon layers may be used as the charge storage layers. In various embodiments, floating gates formed with conductive layers such as polysilicon layers may be used as the charge storage layers. Further, the charge storage layers may also be formed with insulating films containing a large number of semiconductor nanocrystals or high-k films such as hafnia (hafnium oxide films).

In various embodiments, different techniques for forming silicon oxide films have been mentioned. However, the present invention is not limited to those specific examples. For instance, any direct oxidation technique such as a thermal oxidation technique, a plasma oxidation technique, LPRO, or ISSG, or thermal CVD, or plasma CVD may be utilized when appropriate.

It is noted that the various embodiments of the invention described herein are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit®Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 10:
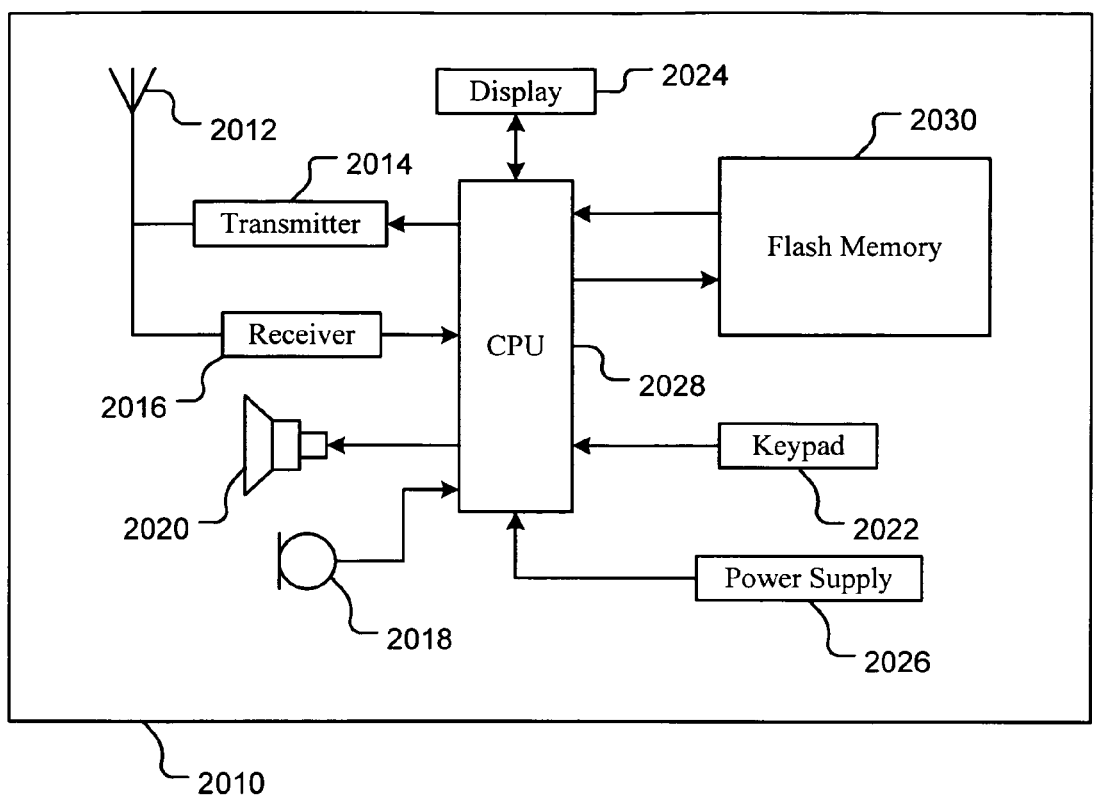
FIG. 10 illustrates a block diagram of an exemplary portable phone, upon which various embodiments of the invention may be implemented.

FIG. 10 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 can include, but is not limited to, an antenna 2012 coupled to a transmitter 2014 and a receiver 2016, as well as a microphone 2018, a speaker 2020, a keypad 2022, and a display 2024. The cell phone 2010 can also include, but is not limited to, a power supply 2026 and a central processing unit (CPU) 2028, which may be an embedded controller, conventional microprocessor, or the like. In addition, the cell phone 2010 can include integrated, flash memory 2030. Flash memory 2030 can be implemented in a wide variety of ways. For example, flash memory 2030 can be implemented in any manner similar to that described herein, but is not limited to such. For example in an embodiment, flash memory 2030 can be implemented in a manner similar to any flash memory described herein, but is not limited to such. An embodiment of the invention also provides a method of manufacturing flash memory 2030. In various embodiments, the flash memory 2030 can be utilized with various devices, such as mobile phones, cellular phones, internet protocol phones, and/or wireless phones.

Flash memory 2030 can be implemented in two primary varieties, NOR-type flash and NAND-type flash. While the general memory storage transistor can be the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory 2030 is applicable to a variety of devices other than portable phones. For instance, flash memory 2030 can be utilized in personal digital assistants, set-top boxes, digital video recorders, networking and telecommunication equipments, printers, computer peripherals, automotive navigation devices, and gaming systems, but is not limited to such.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 11:
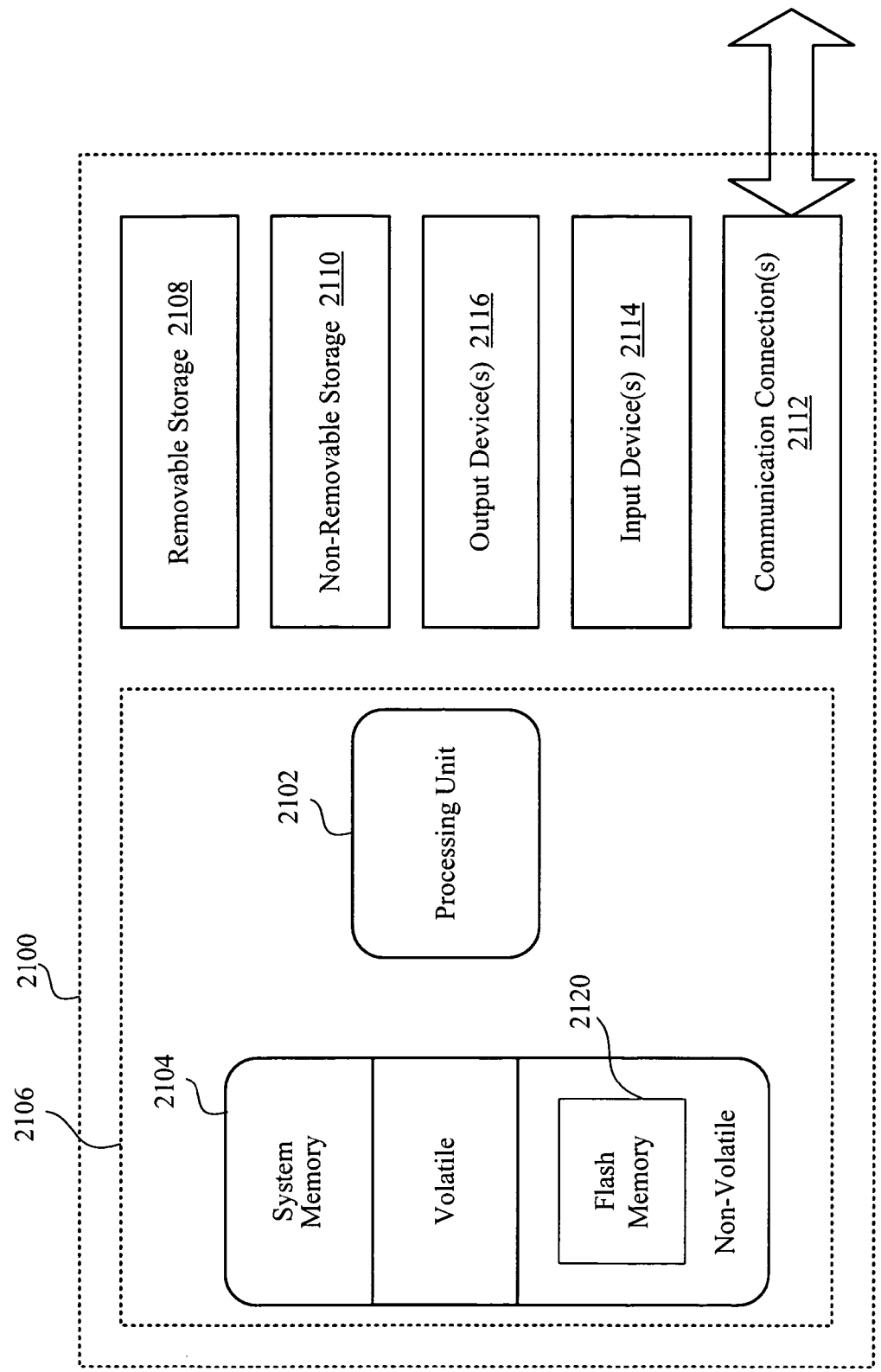
FIG. 11 illustrates a block diagram of an exemplary computing device, upon which various embodiments of the invention may be implemented.

FIG. 11 illustrates a block diagram of an exemplary computing device 2100, upon which various embodiments of the invention can be implemented. Although computing device 2100 is shown and described in FIG. 11 as having certain numbers and types of elements, the embodiments are not necessarily limited to the exemplary implementation. That is, computing device 2100 can include elements other than those shown, and can include more elements than the elements that are shown. For example, computing device 2100 can include a greater number of processing units than the one (processing unit 2102) shown. In an embodiment, computing device 2100 can include additional components not shown in FIG. 11.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory 2120 is especially useful with small-form-factor computing devices such as PDAs and portable gaming devices. Flash memory 2120 offers several advantages. In one example, flash memory 2120 is able to offer fast read access times while at the same time being able to withstand shocks and bumps better than standard hard disks. This can be desirable as small computing devices are often moved around and encounter frequent physical impacts. Also, flash memory 2120 is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory 2120, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 11 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 can be implemented in a wide variety of ways. For example, flash memory 2120 can be implemented in any manner similar to that described herein, but is not limited to such. For example in an embodiment, flash memory 2120 can be implemented in a manner similar to any flash memory described herein, but is not limited to such. An embodiment of the invention also provides a method of manufacturing flash memory 2120. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 12:
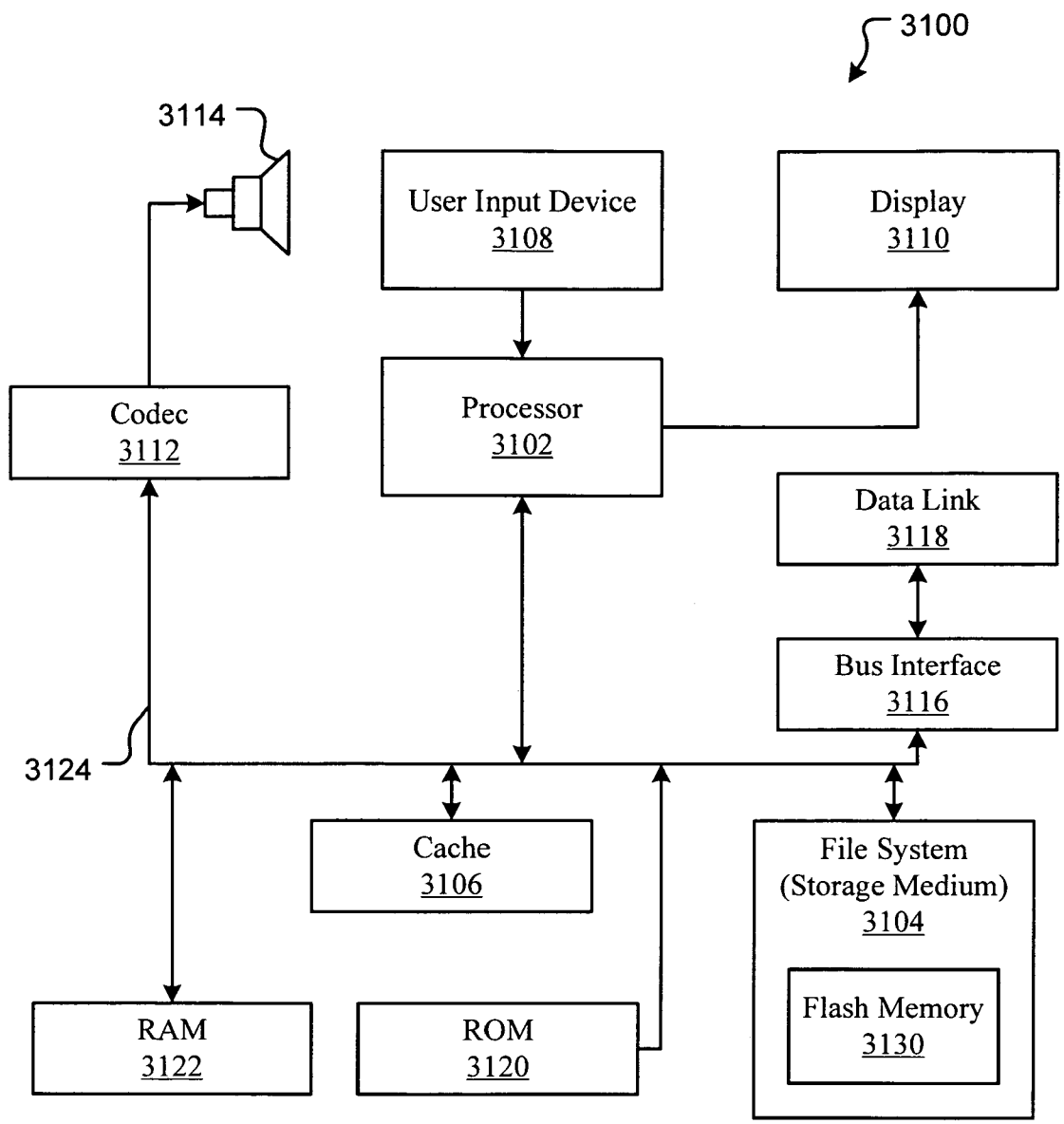
FIG. 12 illustrates an exemplary portable multimedia device, or media player, in accordance with various embodiments of the invention.

FIG. 12 shows an exemplary portable multimedia device, or media player, 3100 in accordance with an embodiment of the invention. The media player 3100 can include a processor 3102 that pertains to a microprocessor or controller for controlling the overall operation of the media player 3100. The media player 3100 can store media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 can include flash memory 3130. In the present embodiment, the flash memory 3130 can be implemented in a wide variety of ways. For example, flash memory 3130 can be implemented in any manner similar to that described herein, but is not limited to such. For example in an embodiment, flash memory 3130 can be implemented in any manner similar to any flash memory described herein, but is not limited to such. An embodiment of the invention also provides a method of manufacturing flash memory 3130. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

In various embodiments in accordance with the invention, it is noted that any mention of "couple", "coupled", and/or "coupling" may include direct and/or indirect connection between elements.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

I claim:

1. A semiconductor device comprising:
   a groove that is formed in a semiconductor substrate;
   bottom oxide films that are formed on both side faces of the groove;
   two charge storage layers that are formed on side faces of the bottom oxide films;
   top oxide films that are formed on side faces of the two charge storage layers, wherein said top oxide films physically contact said bottom oxide films in the groove;
   a silicon oxide layer that is formed on a bottom face of the groove, and has a smaller film thickness than one of the top oxide films, wherein said silicon oxide layer has a smaller film thickness than a film thickness of one of the bottom oxide films located below said two charge storage layers; and
   a word line that is formed on side faces of the top oxide films and on the silicon oxide layer, wherein said word line extends below said two charge storage layers.

2. The semiconductor device of claim 1, wherein said word line is a gate electrode corresponding to the two charge storage layers.

3. The semiconductor device of claim 1, further comprising a bit line that is provided on either side of the groove and in the semiconductor substrate.

4. The semiconductor device of claim 1, wherein the charge storage layers include silicon nitride films.

5. The semiconductor device of claim 1, wherein the charge storage layers include floating gates.

6. A computing device comprising:
   a processor;
   an input component coupled to the processor;
   an output component coupled to the processor; and
   a memory coupled to the processor, the memory comprising:
      a groove that is formed in a semiconductor substrate;
      bottom oxide films that are formed on both side faces of the groove;
      two charge storage layers that are formed on side faces of the bottom oxide films;
      top oxide films that are formed on side faces of the two charge storage layers, wherein said top oxide films physically contact said bottom oxide films in the groove;
      a silicon oxide layer that is formed on a bottom face of the groove, and has a smaller film thickness than one of the top oxide films, wherein said silicon oxide layer has a smaller film thickness than a film thickness of one of the bottom oxide films located below said two charge storage layers; and
      a word line that is formed on side faces of the top oxide films and on the silicon oxide layer, wherein said word line extends below said two charge storage layers.

7. The computing device of claim 6, further comprising:
   a codec coupled to the processor.

8. The computing device of claim 6, wherein said computing device is a personal digital assistant.

9. The computing device of claim 6, wherein said computing device is a gaming system.

10. The computing device of claim 6, wherein said computing device is portable notebook computer.

11. The computing device of claim 6, wherein said memory is flash memory.

12. The computing device of claim 6, wherein said memory is NAND flash memory.

13. The computing device of claim 6, wherein said memory is NOR flash memory.

14. A semiconductor device comprising:
   a groove that is formed in a semiconductor substrate;
   bottom oxide films that are formed on both side faces of the groove;
   two charge storage layers that are formed on side faces of the bottom oxide films;
   top oxide films that are formed on side faces of the two charge storage layers;
   a silicon oxide layer that is formed on a bottom face of the groove, and has a smaller film thickness than one of the top oxide films, wherein said silicon oxide layer has a smaller film thickness than a film thickness of one of the bottom oxide films located below said two charge storage layers, wherein said silicon oxide layer directly contacts said top oxide films and said bottom oxide films in the groove; and
   a word line that is formed on side faces of the top oxide films and on the silicon oxide layer, wherein said word line extends below said two charge storage layers.

15. The semiconductor device of claim 14, wherein said word line is a gate electrode corresponding to the two charge storage layers.

16. The semiconductor device of claim 14, further comprising a bit line that is provided on either side of the groove and in the semiconductor substrate.

17. The semiconductor device of claim 14, wherein the charge storage layers include silicon nitride films.

18. The semiconductor device of claim 14, wherein the charge storage layers include floating gates.

19. The semiconductor device of claim 14, wherein said silicon oxide layer has a smaller film thickness than said top oxide films.

20. The semiconductor device of claim 14, wherein said silicon oxide layer has a smaller film thickness than said bottom oxide films.

* * * * *